United States Patent
Kosowsky

(10) Patent No.: US 7,923,844 B2
(45) Date of Patent: Apr. 12, 2011

(54) SEMICONDUCTOR DEVICES INCLUDING VOLTAGE SWITCHABLE MATERIALS FOR OVER-VOLTAGE PROTECTION

(75) Inventor: Lex Kosowsky, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 1099 days.

(21) Appl. No.: 11/602,881

(22) Filed: Nov. 21, 2006

(65) Prior Publication Data
US 2007/0114640 A1    May 24, 2007

Related U.S. Application Data

(60) Provisional application No. 60/739,724, filed on Nov. 22, 2005.

(51) Int. Cl.
*H01L 23/28* (2006.01)

(52) U.S. Cl. ........ 257/777; 257/778; 257/787; 257/686; 257/E23.117

(58) Field of Classification Search .................... 257/777
See application file for complete search history.

(56) References Cited

U.S. PATENT DOCUMENTS

| | | | |
|---|---|---|---|
| 3,347,724 A | 10/1967 | Schneble, Jr. et al. | |
| 3,685,026 A | 8/1972 | Wakabayashi et al. | |
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger et al. | |
| 4,591,411 A | 5/1986 | Reimann | |
| 4,642,160 A | 2/1987 | Burgess | |
| 4,702,860 A | 10/1987 | Kinderov et al. | |

(Continued)

FOREIGN PATENT DOCUMENTS

CH        663491 A5       12/1987

(Continued)

OTHER PUBLICATIONS

U.S. Appl. No. 11/562,222, Kosowsky, Wireless Communication Device Using Voltage Switchable Dielectric Material, filed Nov. 21, 2006.

(Continued)

*Primary Examiner* — Kenneth A Parker
*Assistant Examiner* — Jose R Diaz
(74) *Attorney, Agent, or Firm* — Carr & Ferrell LLP

(57) ABSTRACT

Semiconductor devices are provided that employ voltage switchable materials for over-voltage protection. In various implementations, the voltage switchable materials are substituted for conventional die attach adhesives, underfill layers, and encapsulants. While the voltage switchable material normally functions as a dielectric cmaterial, during an over-voltage event the voltage switchable material becomes electrically conductive and can conduct electricity to ground. Accordingly, the voltage switchable material is in contact with a path to ground such as a grounded trace on a substrate, or a grounded solder ball in a flip-chip package.

9 Claims, 3 Drawing Sheets

U.S. PATENT DOCUMENTS

| | | | |
|---|---|---|---|
| 4,726,877 A | 2/1988 | Fryd et al. | |
| 4,726,991 A | 2/1988 | Hyatt et al. | |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hivley | |
| 5,956,612 A | 9/1999 | Elliott et al. | |
| 5,962,815 A | 10/1999 | Lan et al. | |
| 5,970,321 A * | 10/1999 | Hively | 438/123 |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,239,687 B1 * | 5/2001 | Shrier et al. | 338/21 |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski | |
| 6,433,394 B1 | 8/2002 | Intrater | |
| 6,448,900 B1 | 9/2002 | Chen | |
| 6,455,916 B1 | 9/2002 | Robinson | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,709,944 B1 | 3/2004 | Durocher et al. | |
| 6,741,217 B2 | 5/2004 | Toncich et al. | |
| 6,797,145 B2 | 9/2004 | Kosowsky | |
| 6,882,051 B2 | 4/2005 | Majumdar et al. | |
| 6,903,175 B2 | 6/2005 | Gore et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 | 5/2006 | Shrier et al. | |
| 7,053,468 B2 | 5/2006 | Lee | |
| 7,064,353 B2 | 6/2006 | Bhat | |
| 7,132,922 B2 | 11/2006 | Harris et al. | |
| 7,141,184 B2 | 11/2006 | Chacko et al. | |
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 * | 4/2007 | Fjelstad et al. | 257/355 |
| 7,218,492 B2 | 5/2007 | Shrier | |
| 7,279,724 B2 | 10/2007 | Collins et al. | |
| 7,320,762 B2 | 1/2008 | Greuter et al. | |
| 7,417,194 B2 | 8/2008 | Shrier | |
| 7,446,030 B2 | 11/2008 | Kosowsky | |
| 7,492,504 B2 | 2/2009 | Chopra et al. | |
| 7,528,467 B2 | 5/2009 | Lee | |
| 7,535,462 B2 | 5/2009 | Spath et al. | |
| 7,585,434 B2 | 9/2009 | Morita | |
| 2002/0004258 A1 * | 1/2002 | Nakayama et al. | 438/107 |
| 2002/0061363 A1 | 5/2002 | Halas et al. | |
| 2003/0010960 A1 | 1/2003 | Greuter et al. | |
| 2003/0079910 A1 | 5/2003 | Kosowsky | |
| 2004/0095658 A1 | 5/2004 | Buretea et al. | |
| 2004/0154828 A1 | 8/2004 | Moller et al. | |
| 2004/0211942 A1 | 10/2004 | Clark et al. | |
| 2005/0026334 A1 | 2/2005 | Knall | |
| 2005/0106098 A1 | 5/2005 | Tsang et al. | |
| 2005/0218380 A1 | 10/2005 | Gramespacher et al. | |
| 2005/0274455 A1 * | 12/2005 | Extrand | 156/272.4 |
| 2005/0274956 A1 | 12/2005 | Bhat | |
| 2006/0060880 A1 | 3/2006 | Lee et al. | |
| 2006/0152334 A1 | 7/2006 | Maercklein et al. | |
| 2006/0167139 A1 | 7/2006 | Nelson et al. | |
| 2006/0181826 A1 | 8/2006 | Dudnikov, Jr. et al. | |

| | | | |
|---|---|---|---|
| 2006/0181827 A1 | 8/2006 | Dudnikov, Jr. et al. | |
| 2006/0199390 A1 | 9/2006 | Dudnikov, Jr. et al. | |
| 2006/0211837 A1 | 9/2006 | Ko et al. | |
| 2006/0291127 A1 | 12/2006 | Kim et al. | |
| 2007/0116976 A1 | 5/2007 | Tan et al. | |
| 2007/0139848 A1 | 6/2007 | Harris et al. | |
| 2007/0146941 A1 | 6/2007 | Harris et al. | |
| 2007/0208243 A1 | 9/2007 | Gabriel et al. | |
| 2008/0045770 A1 | 2/2008 | Sigmund et al. | |
| 2008/0047930 A1 | 2/2008 | Blanchet et al. | |
| 2008/0278873 A1 | 11/2008 | Leduc et al. | |
| 2009/0309074 A1 | 12/2009 | Chen et al. | |
| 2010/0270545 A1 | 10/2010 | Kosowsky | |
| 2010/0270546 A1 | 10/2010 | Kosowsky | |
| 2010/0271831 A1 | 10/2010 | Kosowsky et al. | |
| 2010/0281453 A1 | 11/2010 | Kosowsky et al. | |
| 2010/0281454 A1 | 11/2010 | Kosowsky et al. | |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 1003229 A1 | 5/2000 |
| EP | 0790758 | 11/2004 |
| EP | 1542240 A2 | 6/2006 |
| JP | 56091464 A | 7/1981 |
| JP | 63 195275 A | 8/1988 |
| JP | 2000 062076 A1 | 2/2000 |
| WO | WO97/26665 | 7/1997 |
| WO | WO98/23018 | 5/1998 |
| WO | WO99/24992 | 5/1999 |
| WO | WO 2005/100426 A1 | 10/2005 |

OTHER PUBLICATIONS

U.S. Appl. No. 11/562,289, Kosowsky, Light-Emitting Device Using Voltage Switchable Dielectric Material, filed Nov. 21, 2006.
U.S. Appl. No. 11/602,881, Kosowsky, Semiconductor Devices Including Voltage Switchable Materials for Over-Voltage Protection, filed Nov. 21, 2006.
U.S. Appl. No. 11/829,946, Kosowsky, Voltage Switchable Dielectric Material Having Conductive or Semi-Conductive Organic Material, filed Jul. 29, 2007.
U.S. Appl. No. 11/829,948, Kosowsky, Voltage Switchable Dielectric Material Having High Aspect Ratio Particles, filed Jul. 29, 2007.
U.S. Appl. No. 11/829,951, Kosowsky, Voltage Switchable Dielectric Material Having Conductive or Semi-Conductive Organic Material, filed Jul. 29, 2007.
U.S. Appl. No. 11/860,522, Kosowsky, Technique for Plating Substrate Devices Using Voltage Switchable Dielectric Material and Light Assistance, filed Sep. 24, 2007.
U.S. Appl. No. 11/860,530, Kosowsky, System and Method for Including Protective Voltage Switchabel Dielectric Material in the Design or Simulation of Substrate Devices, filed Sep. 24, 2007.
U.S. Appl. No. 11/881,896, Kosowsky, Device Applications for Voltage Switchable Dielectric Material Having High Aspect Ratio Particles, filed Jul. 29, 2007.
U.S. Appl. No. 11/903,820, Kosowsky, Formulations for Voltage Switchable Dielectric Materials Having a Stepped Voltage Response and Methods for Making the Same, filed Sep. 24, 2007.
U.S. Appl. No. 12/193,603, Kosowsky, Voltage Switchable Dielectric Material Incorporating Modified High Aspect Ratio Particles, filed Aug. 18, 2008.
U.S. Appl. No. 12/284,790, Kosowsky, Methods for Fabricating Current-Carrying Structures Using Voltage Switchable Dielectric Materials, filed Sep. 24, 2008.
U.S. Appl. No. 12/356,490, Fleming, Voltage Switchable Dielectric Material Having Bonded Particle Constituents, filed Jan. 20, 2009.
U.S. Appl. No. 12/370,589, Fleming, Voltage Switchable Dielectric Material With Superior Physical Properties for Structural Applications, filed Feb. 12, 2009.
U.S. Appl. No. 12/407,346, Fleming, Voltage Switchable Dielectric Materials With Low Band Gap Polymer Binder or Composite, filed Mar. 19, 2009.
U.S. Appl. No. 12/417,589, Kosowsky, Substrate Device or Package Using Embedded Layer of Voltage Switchable Dielectric Material in a Vertical Switching Configuration, filed Apr. 2, 2009.
U.S. Appl. No. 12/541,963, Kosowsky, Core Layer Structure Having Voltage Switchable Dielectric Material, filed Aug. 16, 2009.
U.S. Appl. No. 12/561,195, Kosowsky, Voltage Switchable Dielectric Material Containing Boron Compound, filed Sep. 16, 2009.
U.S. Appl. No. 12/571,318, Kosowsky, Voltage Switchable Dielectric Material Incorporating Conductive Core-Shell Particles, filed Sep. 30, 2009.
Breton et al., "Mechanical properties of multiwall carbon nanotubes/epoxy composites: influence of network morphology," Carbon Elsevier UK, vol. 42, No. 5-6, pp. 1027-1030 (2004).
Granstrom et al., "Laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Saunders et al., "Nanoparticle-polymer photovoltaic cells," Adv. Colloid Int. Sci., vol. 138, No. 1, pp. 1-23 (2007).
U.S. Appl. No. 10/875,372, filed Apr. 21, 2005, Shrier, Karen P.
U.S. Appl. No. 10/366,174, filed Aug. 19, 2004, Shrier, Karen P.
Fullerene Chemistry- Wikipedia, http://en.wikipedia.org/wiki/Fullerene/chemistry, 6 pages, printed Apr. 8, 2010.
U.S. Appl. No. 12/714,354, Kosowsky, filed Feb. 26, 2010.
U.S. Appl. No. 12/714,358, Kosowsky, filed Feb. 26, 2010.
U.S. Appl. No. 12/703,674, Kosowsky, filed Feb. 10, 2010.
U.S. Appl. No. 12/703,701, Kosowsky, filed Feb. 10, 2010.
U.S. Appl. No. 12/703,723, Kosowsky, filed Feb. 10, 2010.
U.S. Appl. No. 12/608,297, Kosowsky, Metal Deposition, filed Oct. 29, 2009.
U.S. Appl. No. 12/608,301, Kosowsky, Metal Deposition, filed Oct. 29, 2009.
U.S. Appl. No. 12/608,309, Kosowsky, Metal Deposition, filed Oct. 29, 2009.
U.S. Appl. No. 12/608,315, Kosowsky, Metal Deposition, filed Oct. 29, 2009.
U.S. Appl. No. 12/608,326, Kosowsky, Metal Deposition, filed Oct. 29, 2009.
U.S. Appl. No. 12/694,702, Kosowsky, Substrates Having Voltage Switchable Dielectric Materials, filed Jan. 27, 2010.
U.S. Appl. No. 12/731,557, Kosowsky, Components Having Voltage Switchable Dielectric Materials, filed Mar. 25, 2010.
U.S. Appl. No. 12/607,952, Fleming, filed Oct. 28, 2009.
U.S. Appl. No. 12/642,799, Fleming, filed Dec. 19, 2009.
U.S. Appl. No. 12/638,632, Fleming, filed Dec. 15, 2009.
U.S. Appl. No. 12/692,573, Fleming, filed Jan. 22, 2010.
U.S. Appl. No. 12/717,102, Kosowsky, filed Mar. 3, 2010.
Levinson et al. "The Physics of Metal Oxide Varistors," J. App. Phys. 46 (3): 1332-1341 (1975).
Supplemental European Search Report for, EP 06 83 8276 European counterpart of U.S. Appl. No. 11/602,881, Published as EP 1969627 (Sep. 17, 2008).
Facchetti, Antonio, "Semiconductors for Organic Transistors", Materials Today, vol. 10, No. 3, pp. 28-37, (2007).
Reese, Colin and Bao, Zhenan, "Organic Single-Crystal Field-Effect Transistors", Materials Today, vol. 10, No. 3, pp. 20-27, (2007).
Modine, F.A. and Hyatt, H.M. "New Varistor Material", Journal of Applied Physics, 64 (8), Oct. 15, 1988, pp. 4229-4232.
Celzard, A., et al.,Journal of Physics: Condensed Matter, 9 (1997) pp. 2225-2237.

\* cited by examiner

SEMICONDUCTOR DEVICES INCLUDING VOLTAGE SWITCHABLE MATERIALS FOR OVER-VOLTAGE PROTECTION

CROSS-REFERENCE TO RELATED APPLICATIONS

This application claims priority to U.S. Provisional patent Application No. 60/739,724 filed on Nov. 22, 2005 and entitled "Over-Voltage Protection for Semiconductor Devices Using Voltage Switchable Dielectric Material as an Encapsulant or Underfill" incorporated herein by reference.

BACKGROUND OF THE INVENTION

1. Field of the Invention

The present invention relates generally to the field of electronic devices and more particularly to over-voltage protection.

2. Description of the Prior Art

Semiconductor devices comprising a semiconductor die or chip are easily affected or destroyed by over-voltage events. Examples of over-voltage events include electrostatic discharge (ESD), line transients, and lightening strikes. Electrostatic discharge commonly occurs when a person carrying a static charge touches a semiconductor device. Line transients include power surges on AC power lines, and can also be caused by events such as closing a switch or starting a motor.

Voltage switchable materials, also known as nonlinear resistance materials, are materials that normally behave as dielectric materials, but upon application of a sufficient voltage, known as a switch voltage, will rapidly become electrically conductive. The ability of voltage switchable materials to switch between non-conductive and conductive states makes these materials well suited for over-voltage protection applications.

In the prior art, voltage switchable materials have been used for over-voltage protection in a number of different ways. For example, in Behling et al. (U.S. Pat. No. 6,570,765), microgaps are defined between contact portions and ground bars are filled with a voltage switchable material. Intrater (U.S. Pat. No. 6,433,394) teaches an integrated circuit chip with a plurality of conductive pads disposed around the periphery of a ground plane with a precision gap therebetween, and a protection device comprising a voltage switchable material placed over the integrated circuit chip. Shrier et al. (U.S. Pat. No. 6,542,065) teaches a variable voltage protection component comprising a reinforcing layer embedded with a voltage switchable material. In the prior art, therefore, achieving over-voltage protection through the use of voltage switchable materials requires redesigning semiconductor devices to include additional features, e.g., microgaps in Behling et al., a protection device in Intrater, and a reinforcing layer in Shrier et al.

SUMMARY

An exemplary semiconductor device of the present invention comprises a dielectric substrate and a semiconductor die. The dielectric substrate includes, on one surface thereof, a die bonding pad and a plurality of conductive traces. The semiconductor die is attached to the die bonding pad with a die attach adhesive comprising a first voltage switchable material. The die attach adhesive also contacts a conductive trace of the plurality of conductive traces. In order to contact the conductive trace, in some instances, the die attach adhesive extends beyond the die bonding pad. In other instances, the conductive trace extends between the semiconductor die and the die bonding pad. In further embodiments, the semiconductor device comprises an encapsulant comprising a second voltage switchable material which can be the same as the first voltage switchable material.

Another exemplary semiconductor device of the present invention comprises a dielectric substrate, a semiconductor die, and an underfill layer. The dielectric substrate includes, on one surface, a die bonding pad including a bond pad for ground. The semiconductor die is flip-chip bonded to the die bonding pad by a plurality of solder balls. The underfill layer comprises a first voltage switchable material and is disposed between the die bonding pad and the semiconductor die. The underfill layer also contacts a solder ball of the plurality of solder balls, the solder ball being connected to the bond pad for ground. In further embodiments, the semiconductor device comprises an encapsulant comprising a second voltage switchable material which can be the same as the first voltage switchable material.

Still another exemplary semiconductor device of the present invention comprises a dielectric substrate, a semiconductor die, and an encapsulant. The dielectric substrate includes, on one surface thereof, a die bonding pad and a plurality of conductive traces, and the semiconductor die is attached to the die bonding pad. The encapsulant comprises a first voltage switchable material that encapsulates the semiconductor die. In some embodiments, the semiconductor die is attached to the die bonding pad with a die attach adhesive, and in some of these embodiments the die attach adhesive comprises a second voltage switchable material. As above, the first and second voltage switchable materials can be the same.

In further embodiments the semiconductor die is flip-chip bonded to the die bonding pad and the semiconductor device further comprises an underfill layer disposed between the die bonding pad and the semiconductor die. The underfill layer can comprise a second voltage switchable material, in some instances. In further embodiments the semiconductor device comprises a ground trace disposed on a surface of the substrate and in contact with the encapsulant.

Yet another exemplary semiconductor device of the present invention comprises a dielectric substrate including, on one surface thereof, a die bonding pad including a bond pad for ground. The semiconductor device also comprises a semiconductor die flip-chip bonded to the die bonding pad by a plurality of solder balls. The semiconductor device further comprises a ball formed of a first voltage switchable material, disposed between the semiconductor die and the substrate, and contacting the bond pad for ground.

Still yet another exemplary semiconductor device of the present invention comprises a dielectric substrate, a semiconductor die, and an encapsulant. The dielectric substrate includes a die bonding pad on one surface thereof, and the semiconductor die is attached to the die bonding pad. The encapsulant includes a first conformal layer and a second layer that overlies the first conformal layer. The first conformal layer comprising a first voltage switchable material that conforms to the semiconductor die and at least part of the dielectric substrate.

A further exemplary semiconductor device of the present invention comprises a wafer-scale package. The wafer-scale package comprises a semiconductor die including a plurality of bond pads on a surface thereof, at least one of the bond pads being a bond pad for ground. The wafer-scale package further comprises solder balls disposed on the bond pads, and an encapsulant comprising a voltage switchable material encasing the semiconductor die, where the solder balls protrude through the encapsulant. The encapsulant contacts a solder ball disposed on the bond pad for ground.

DETAILED DESCRIPTION OF THE INVENTION

The present invention provides over-voltage protection to semiconductor devices, such as packaged semiconductor dies. Packaged semiconductor dies can be either conventionally wire bonded or flip-chip bonded, for instance, in a chip-scale package (CSP). Other semiconductor devices that can employ the present invention include wafer-scale packages. Over-voltage protection is achieved in the present invention by the substitution of voltage switchable materials for other materials of the semiconductor device. In various implementations herein, the voltage switchable material replaces a dielectric material and is in contact with a conductor that may be connected to an electrical ground. Thus, the voltage switchable material generally serves as a dielectric material, but during an over-voltage event the voltage switchable material is able to conduct electricity to the electrical ground.

Figure 1:
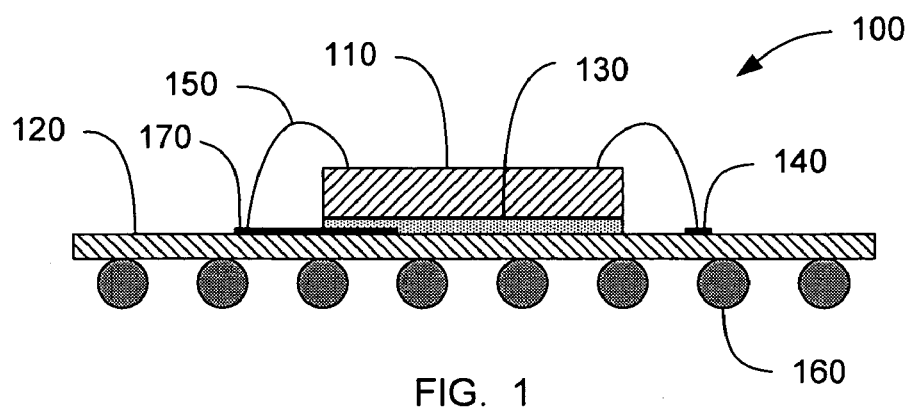
FIG. 1 is a cross-sectional view of a semiconductor device according to an exemplary embodiment of the present invention.

FIG. 1 illustrates a cross-sectional view of an exemplary semiconductor device 100 of the invention, such as an integrated circuit. The semiconductor device 100 comprises a semiconductor die or chip 110 attached to a substrate 120. In this embodiment, the semiconductor die 110 is attached to a die bonding pad (not shown) of the substrate 120 with a die attach adhesive 130 comprising a voltage switchable material. It will be appreciated that the die bonding pad of the substrate 120 is merely a region of the substrate that has been designated as the location for the semiconductor die 110. The die bonding pad therefore need not be demarked, though in some embodiments the die bonding pad is clearly defined.

The semiconductor die 110 includes bond pads (not shown), on a top surface of the semiconductor die 110, that are electrically connected to electrically conductive traces 140 on the substrate 120 by wires 150. The thickness of the traces 140 are greatly exaggerated in the drawings for illustrative purposes. The traces 140 can be connected to solder balls 160 by vias (not shown) through the substrate 120, for example. The solder balls 160, in turn, can be connected to wiring on a printed wiring board (not shown) leading to sources of power, ground, and signals. In this way the semiconductor die 110 is connected to power and ground and is able to send and receive signals. It should be noted that the term "solder ball" is used broadly herein to also include solder bumps.

In the embodiment illustrated by FIG. 1, one bond pad on the semiconductor die 110 is connected to ground through a ground trace 170. The ground trace 170 extends between the semiconductor die 110 and the die bonding pad so that the ground trace 170 is in contact the die attach adhesive 130. Put another way, the ground trace 170 extends into the die bonding pad. During the die attach process the die attach adhesive 130 is applied over die bonding pad and over that portion of the ground trace 170 extending into the die bonding pad. It will be appreciated that the typical semiconductor die 110 will include multiple bond pads for ground, and any, or all, of these bond pads can be connected to ground traces 170.

Suitable voltage switchable materials for the die attach adhesive 130 include a matrix material blended with a particulate conductor. For the purposes of die attach adhesive 130, the matrix material can be similar to conventional die attach adhesives and can include epoxies, polyimides, silicones, and combinations thereof. Accordingly, the die attach adhesive 130 can be applied by conventional techniques. Suitable voltage switchable materials are taught by Wakabayashi et al. (U.S. Pat. No. 3,685,026) and Shrier (U.S. Pat. No. 4,977,357), for example.

Additional suitable voltage switchable materials comprise about 30% to 80% by volume of a dielectric material, about 0.1% to 70% by volume of an electrical conductor, and about 0% to 70% by volume of a semiconducting material. Examples of dielectric materials include, but not limited to, silicone polymers, epoxies, polyimide, polyethylene, polypropylene, polyphenylene oxide, polysulphone, solgel materials, ceramers, silicon dioxide, aluminum oxide, zirconium oxide, and other metal oxide insulators. Examples of electrically conductive materials include, but not limited to, metals such as copper, aluminum, nickel, and stainless steel. Examples of semiconducting materials include both organic and inorganic semiconductors. Suitable inorganic semiconductors include silicon, silicon carbide, boron nitride, aluminum nitride, nickel oxide, zinc oxide, and zinc sulfide. Suitable organic semiconductors include poly-3-hexylthiophene, pentacene, perylene, carbon nanotubes, and $C_{60}$ fullerenes.

Figure 2:
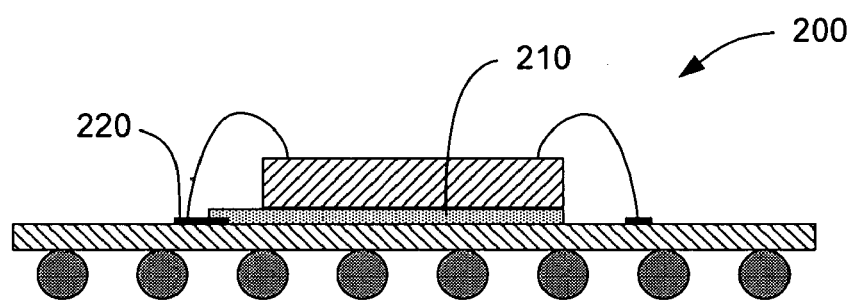
FIG. 2 is a cross-sectional view of a semiconductor device according to another exemplary embodiment of the present invention.

FIG. 2 illustrates a cross-sectional view of another exemplary semiconductor device 200 of the invention. In this embodiment the die attach adhesive 210 at least partially overlays a ground trace 220. Here, the die attach adhesive 210 extends beyond the die bonding pad in order to contact the ground trace 220. The ground trace 220, in some embodiments, extends towards the die bonding pad to minimize the amount of extra die attach adhesive 210 needed to reach the ground trace 220. Similar to the previous embodiment, during the die attach process the die attach adhesive 210 is applied over the die bonding pad and over at least a portion of the ground trace 220. In this and the previously described embodiment, the die attach adhesive 210, 130 normally serves as a dielectric material, but during an over-voltage event will conduct electricity to the ground trace 220, 170 and to ground. In this and the previously described embodiment, the die attach adhesive 210, 130 can be dispensed with the same equipment used to dispense conventional die attach adhesive.

Figure 3:
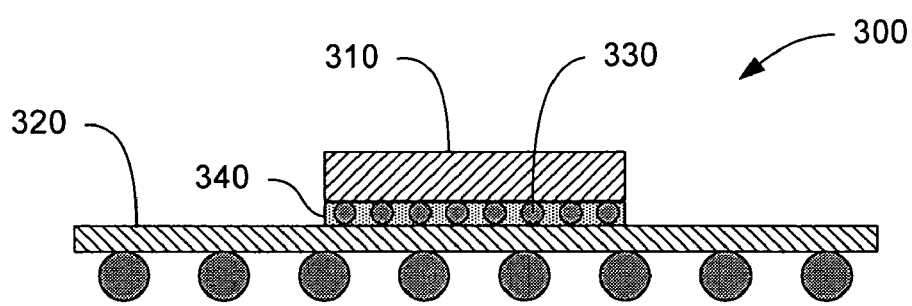
FIG. 3 is a cross-sectional view of a semiconductor device according to another exemplary embodiment of the present invention.

FIG. 3 illustrates a cross-sectional view of still another exemplary semiconductor device 300 of the invention. In this embodiment a semiconductor die 310 is flip-chip bonded to a substrate 320. In flip-chip bonding, the semiconductor die 310 is inverted (relative to the orientation in the prior two embodiments) so that the bond pads on the semiconductor die 310 can be directly connected to a matching set of bond pads on the substrate 320 within the die bonding pad. The connections between opposing pairs of bond pads in flip-chip bonding are made with solder balls 330.

While the solder balls 330 provide a mechanical connection between the semiconductor die 310 and the substrate 320, an underfill layer 340 comprising a voltage switchable material is provided to increase the resiliency of the flip-chip bonding. As in the previous two embodiments, the semiconductor die 310 in the present embodiment has one or more bond pads for ground, each connected by a solder ball 330 to a bond pad (not shown) on the substrate 320. Each of these solder ball 330 connections to ground, within the underfill layer 340, can serve as a ground terminal during an over-voltage event. Advantageously, the voltage switchable material used to form the underfill layer 340 can be injected between the semiconductor die 310 and the substrate 320 by the same equipment used to inject conventional underfill materials.

Figure 4:
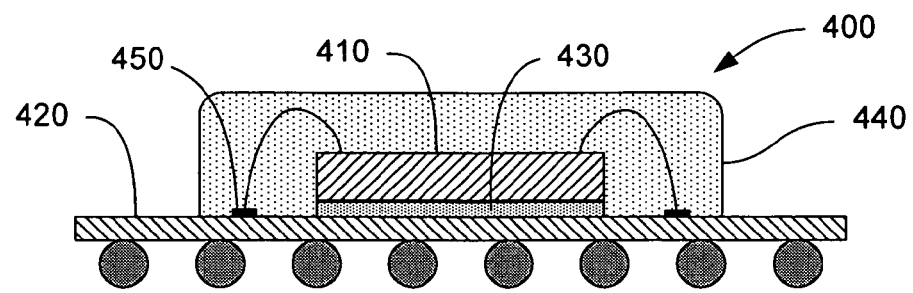
FIG. 4 is a cross-sectional view of a semiconductor device according to another exemplary embodiment of the present invention.
Figure 5:
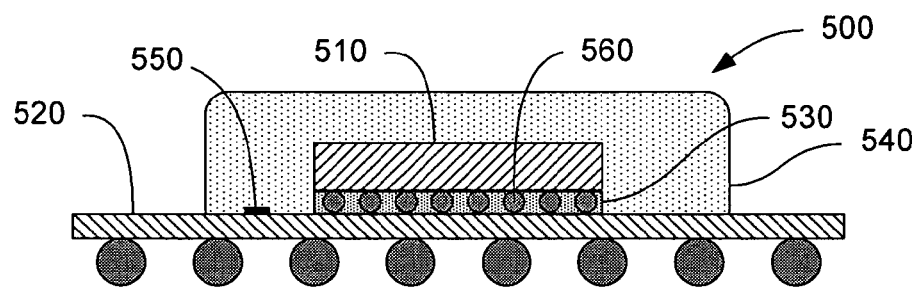
FIG. 5 is a cross-sectional view of a semiconductor device according to another exemplary embodiment of the present invention.

FIGS. 4 and 5 illustrate cross-sectional views of two additional exemplary semiconductor devices 400 and 500 of the invention. The semiconductor device 400 of FIG. 4 comprises a semiconductor die 410 attached to a substrate 420 with a die attach adhesive 430 that in some embodiments comprises a voltage switchable material. The semiconductor device 400 also comprises an encapsulant 440 that comprises a voltage switchable material and encapsulates the semiconductor die 410.

The semiconductor device 500 of FIG. 5 comprises a semiconductor die 510 flip-chip bonded to a substrate 520 and an underfill layer 530 that in some embodiments comprises a voltage switchable material. The semiconductor device 500 also comprises an encapsulant 540 that comprises a voltage switchable material and encapsulates the semiconductor die 510. In the embodiments illustrated in FIGS. 4 and 5, the encapsulants 440, 540 are normally dielectric but serve to conduct to a proximately situated ground during an over-voltage event. The encapsulants 440, 540 can be applied by conventional methods such as molding and screen printing.

In the embodiment of FIG. 4, any ground trace 450 that is in contact with the encapulant 440 can serve as ground during an over-voltage event. Also in this embodiment, if the die attach adhesive 430 comprises a voltage switchable material, the voltage switchable material of the encapsulant 440 can be either the same or a different voltage switchable material.

In the embodiment of FIG. 5, a ground trace 550 is also provided. The ground trace 550 is in electrical communication with a grounded solder ball 560, in some embodiments. In those embodiments in which the underfill layer 530 also comprises a voltage switchable material, the ground trace 550 is optional as a grounded solder ball 560 can serve as ground during an over-voltage event. Also in the embodiment of FIG. 5, if the underfill layer 530 comprises a voltage switchable material, the voltage switchable material of the encapsulant 540 can be either the same or a different voltage switchable material.

Figure 6:
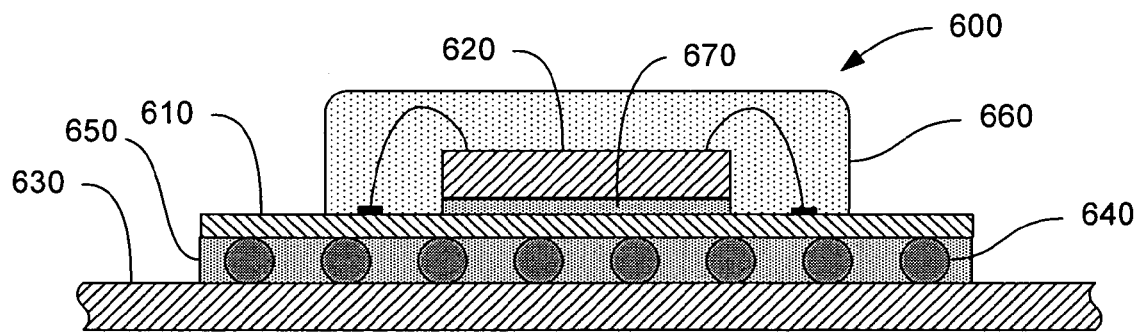
FIG. 6 is a cross-sectional view of a semiconductor device according to another exemplary embodiment of the present invention.

FIG. 6 illustrates a cross-sectional view of still another exemplary semiconductor device 600 of the invention. In this embodiment, a substrate 610 carrying a semiconductor die 620 is mounted to a printed wiring board 630. Solder balls 640 provide electrical connections between the substrate 610 and the printed wiring board 630. As above, some of these connections provide electrical grounding. The semiconductor device 600 also includes an underfill layer 650 that comprises a voltage switchable material. The underfill layer 650 provides over-voltage protection analogously to the underfill layer 340 discussed above with respect to FIG. 3. Although the embodiment shown in FIG. 6 includes a semiconductor die 620 wire bonded to the substrate 610, it will be understood that the semiconductor die 620 can also be flip-chip bonded to the substrate 610. Additionally, in some embodiments an encapsulant 660 and/or a die attach adhesive 670 can also comprise a voltage switchable material. For flip-chip bonding, the die attach adhesive 670 would be replaced with another underfill layer that could also comprise a voltage switchable material.

Figure 7:
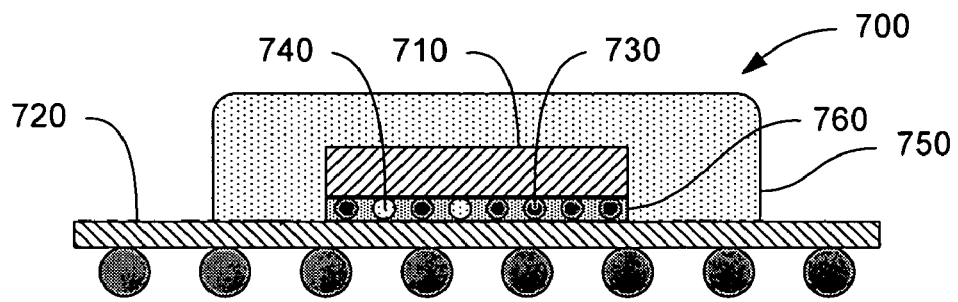
FIG. 7 is a cross-sectional view of a semiconductor device according to another exemplary embodiment of the present invention.

In still another exemplary semiconductor device 700, shown in cross-section in FIG. 7, a semiconductor die 710 is flip-chip bonded to a substrate 720. In this embodiment, some of the solder balls 730 are replaced by balls 740 comprising a voltage switchable material. In this embodiment the balls 740 are disposed between bond pads on the semiconductor die 710 and substrate 720 for ground. Like the solder balls 730, the balls 740 can be formed on the semiconductor die 710 prior to flip-chip bonding by conventional processes such as screen printing. Additionally, in some embodiments an encapsulant 750 and/or an underfill layer 760 can also comprise a voltage switchable material.

Figure 8:
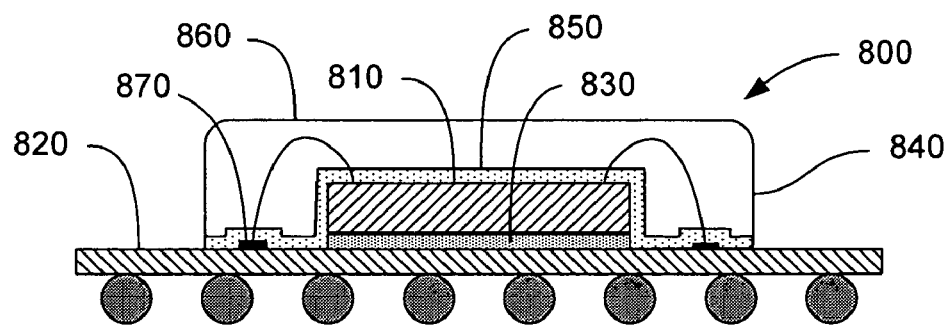
FIG. 8 is a cross-sectional view of a semiconductor device according to another exemplary embodiment of the present invention.

In yet another exemplary semiconductor device 800, shown in cross-section in FIG. 8, a semiconductor die 810 is attached to a substrate 820 by a die attach adhesive 830. In this embodiment, an encapsulant 840 comprises two layers, a conformal layer 850 comprising a voltage svitchable material, and a second layer 860 of a conventional encapsulant disposed over the conformal layer 850. Using a thin, conformal layer 850 in place of the thicker encapsulants 440, 540 of FIGS. 4 and 5 provides the same over-voltage protection but uses less voltage switchable material per semiconductor device 800.

The conformal layer 850 is disposed over the semiconductor die 810 and over a ground trace 870 on the substrate 820. In this way the conformal layer 850 makes contact with a source of ground. In some embodiments, the conformal layer 850 is on the order of 50 mils thick. The conformal layer 850 can be formed, for example, by inkjet printing, screen printing, or painting. The second layer 860 of a conventional encapsulant can be formed by conventional methods such as molding and screen printing, for example. It will be understood that the semiconductor die 810 can also be flip-chip bonded to the substrate 820. As above, the die attach adhesive 830, or an underfill layer in the case of flip-chip bonding, can also comprise a voltage switchable material.

Figure 9:
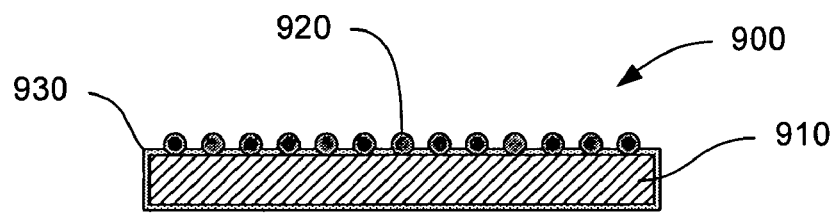
FIG. 9 is a cross-sectional view of a semiconductor device according to another exemplary embodiment of the present invention.

FIG. 9 illustrates a cross-sectional view of yet another exemplary semiconductor device 900 of the invention. The semiconductor device 900 comprises a wafer-scale package. The semiconductor device 900 includes a semiconductor die 910 having solder balls 920 disposed on bonding pads (not shown) and an encapsulant 930 formed to encase the semiconductor die 910. Only the solder balls 920 protrude through the encapsulant 930. The encapsulant 930 comprises a voltage switchable material and is in contact with at least one solder ball 920 disposed on a bond pad for ground.

In the foregoing specification, the invention is described with reference to specific embodiments thereof, but those skilled in the art will recognize that the invention is not limited thereto. Various features. and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A semiconductor device comprising:
   a dielectric substrate including, on a first surface thereof, a conductor;
   a semiconductor die attached to the first surface using a die attach adhesive;
   a voltage switchable material connecting the semiconductor die to the conductor, the voltage switchable material physically contacting both the semiconductor die and the conductor; and
   an encapsulant that encapsulates the semiconductor die, wherein the encapsulant and the die attach adhesive include the voltage switchable material.

2. The semiconductor device of claim 1, wherein the conductor is sandwiched between the die attach adhesive and the die bonding pad.

3. The semiconductor device of claim 1, wherein the die attach adhesive extends beyond the die bonding pad to contact the conductor.

4. The semiconductor device of claim 1, wherein the semiconductor die is flip-chip bonded to the die bonding pad.

5. The semiconductor device of claim 4, wherein flip-chip bonding includes the use of solder balls, and at least one of the solder balls is replaced by a ball including the voltage switchable material.

6. The semiconductor device of claim 5, further comprising an encapsulant including a second voltage switchable material.

7. The semiconductor device of claim 1, wherein the encapsulant includes:
   a first conformal layer comprising the voltage switchable material that conforms to the semiconductor die and at least part of the dielectric substrate, and
   a second layer that overlies at least a portion of the first conformal layer.

8. The semiconductor device of claim 1, wherein the encapsulant encapsulates the semiconductor die and the conductor.

9. The semiconductor device of claim 1, wherein the encapsulant encapsulates the semiconductor die and the die attach adhesive.

* * * * *